(12) United States Patent
Prins et al.

(10) Patent No.: US 7,790,525 B2
(45) Date of Patent: Sep. 7, 2010

(54) METHOD OF ACHIEVING DENSE-PITCH INTERCONNECT PATTERNING IN INTEGRATED CIRCUITS

(75) Inventors: Steven Lee Prins, Richardson, TX (US); James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 470 days.

(21) Appl. No.: 11/874,501

(22) Filed: Oct. 18, 2007

(65) Prior Publication Data

US 2009/0101983 A1    Apr. 23, 2009

(51) Int. Cl.
H01L 21/00 (2006.01)
H01L 21/84 (2006.01)
H01L 21/8234 (2006.01)

(52) U.S. Cl. .................................. 438/153; 438/199

(58) Field of Classification Search ......... 438/153–161, 438/199–214, E27.062, E21.632
See application file for complete search history.

(56) References Cited

U.S. PATENT DOCUMENTS 6,681,379 B2 * 1/2004 Pierrat et al. ................ 438/241

2009/0203216 A1 * 8/2009 Mackey ....................... 438/694

* cited by examiner

Primary Examiner—Cuong Q Nguyen
(74) Attorney, Agent, or Firm—John J. Patti; Wade J. Brady, III; Frederick J. Telecky, Jr.

(57) ABSTRACT

Components in integrated circuits (ICs) are fabricated as small as possible to minimize sizes of the ICs and thus reduce manufacturing costs per IC. Metal interconnect lines are formed on minimum pitches possible using available photolithographic printers. Minimum pitches possible for contacts and vias are larger than minimum pitches possible for metal interconnect lines, thus preventing dense rectilinear grid configurations for contacts and vias. The instant invention is an integrated circuit, and a method of fabricating an integrated circuit, wherein metal interconnect lines are formed on a minimum pitch possible using a photolithographic printer. Contacts and vias are arranged to provide connections to components and metal interconnect lines, as required by the integrated circuit, in configurations that are compatible with the minimum pitch for contacts and vias, including semi-dense arrays.

10 Claims, 5 Drawing Sheets

METHOD OF ACHIEVING DENSE-PITCH INTERCONNECT PATTERNING IN INTEGRATED CIRCUITS

FIELD OF THE INVENTION

This invention relates to the field of integrated circuits. More particularly, this invention relates to methods to improve contact and via lithography.

BACKGROUND OF THE INVENTION

Integrated circuits (ICs) include electronic components, such as transistors, diodes and resistors, that are electrically connected by metal interconnects to form electronic circuits, built on semiconductor substrates, typically wafers. Metal interconnects include horizontal metal lines, typically in several levels, vertical metal vias that connect the horizontal metal lines, and vertical metal contacts that connect components in an IC to a lowest set of horizontal metal lines. Feature sizes and separation distances in ICs are shrinking on a well known trend of technology nodes, articulated in Moore's Law. In each new technology node, it is common practice to scale minimum lateral dimensions and lateral spacing of features in ICs, including widths and spacing of horizontal metal lines, vertical metal vias and vertical metal contacts by a factor applied to all features, typically approximately 70 percent. During IC fabrication, patterns for forming horizontal metal lines, vertical metal vias and vertical metal contacts are generated by photolithographic processes. Feature sizes and spacing smaller than 100 nanometers are often close to a diffraction limit of photolithographic equipment used to generate their patterns. It is common for sizes and spacing of vertical metal vias and vertical metal contacts, when arranged in an orthogonal array of minimum pitch, to be closer to, or even less than, a diffraction limit of corresponding photolithographic equipment than for sizes and spacing of minimum width horizontal metal lines arranged in a minimum pith configuration.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention is an integrated circuit, and a method of fabricating an integrated circuit, wherein metal interconnect lines are formed on a minimum pitch possible using a photolithographic printer. Contacts and vias in the integrated circuit are also formed on a minimum pitch possible using the photolithographic printer. The minimum pitch possible for metal interconnect lines is smaller than the minimum pitch possible for contacts and vias. Therefore, the contacts and vias are arranged to provide connections to components and metal interconnect lines, as required by the integrated circuit, in configurations that are compatible with the minimum pitch for contacts and vias, including semi-dense arrays.

DETAILED DESCRIPTION

Figure 1A:
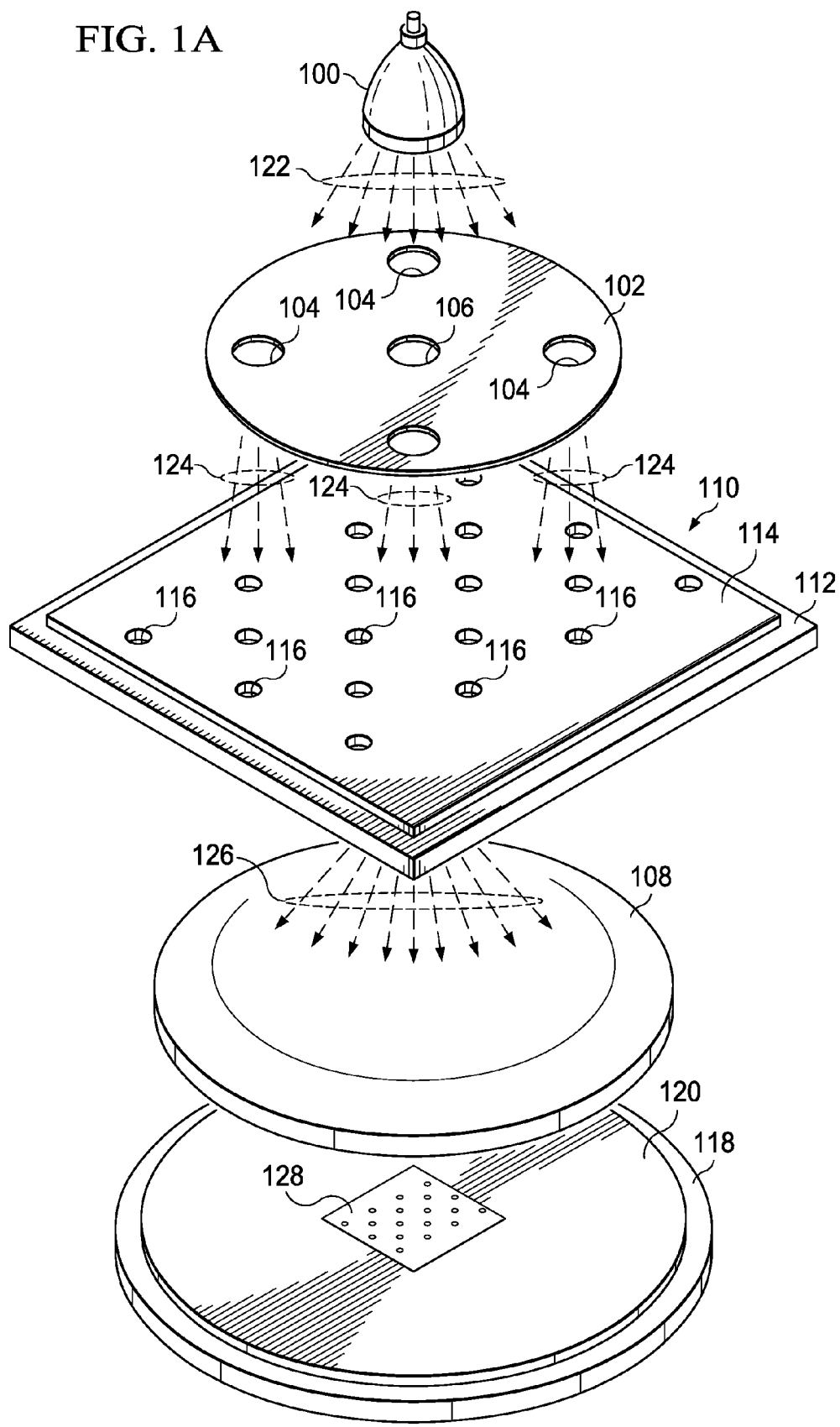
FIG. 1A is a depiction of a contact or via pattern being generated on an IC substrate by photolithographic equipment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of facilitating the reading of this disclosure, vias are understood to mean vertical metal vias, contacts are understood to mean vertical metal contacts, and metal lines are understood to mean horizontal metal interconnect lines. Pitch is defined as a lateral distance between centers of adjacent identical structures. The adjective "minimum" applied to structures refers to the smallest that can be formed using relevant processing equipment. For example, minimum pitch of metal lines is the lateral distance between the centerlines of two minimum width metal lines separated by a minimum space. In another example, minimum pitch of vias is the lateral distance between centers of two minimum diameter vias separated by a minimum space. A dense array is defined as a rectangular array in which all intersections of rows and columns are occupied. A semi-dense array is defined as a rectangular array in which only alternate intersections of rows and columns are occupied.

Figure 1B:
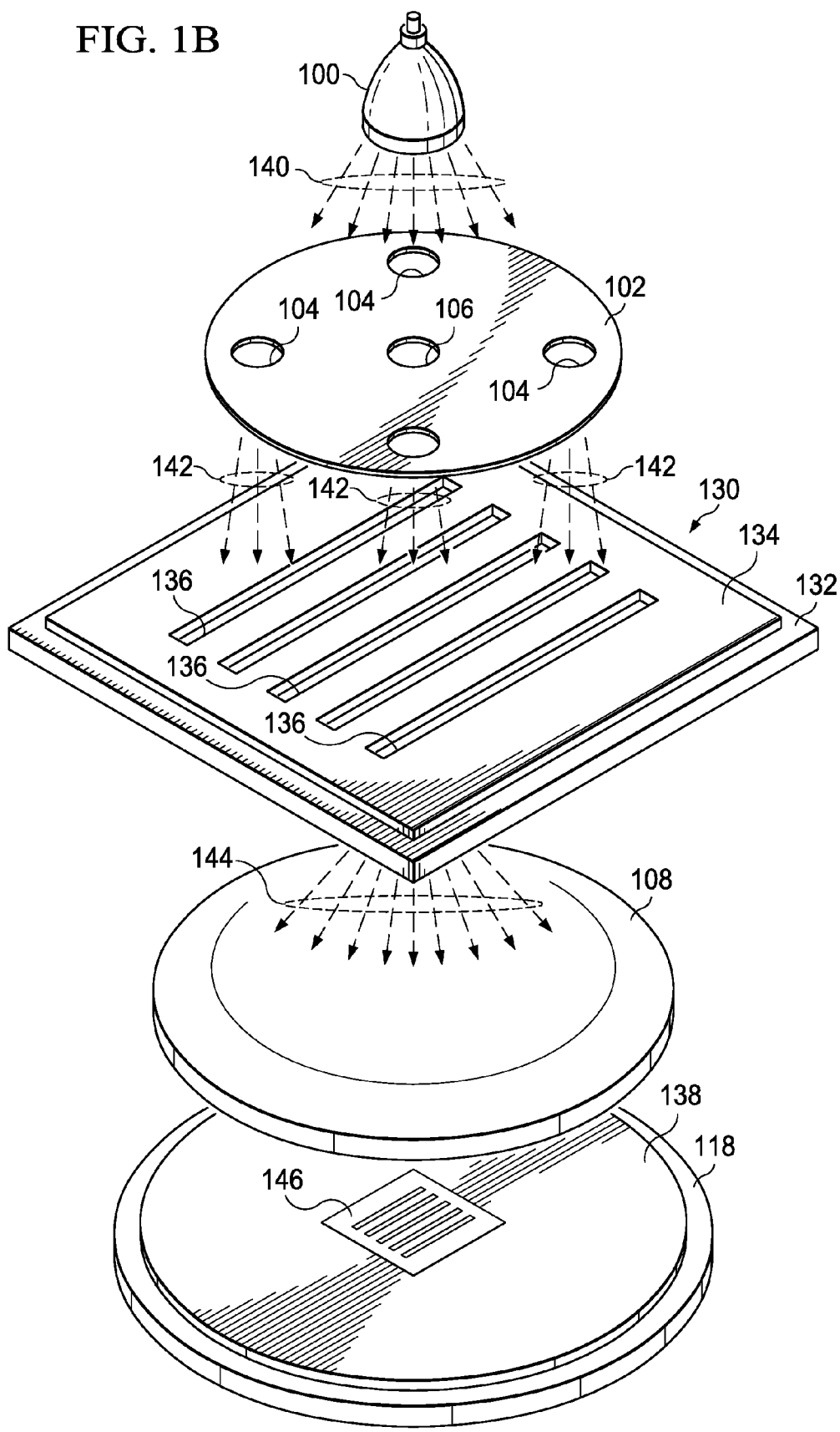
FIG. 1B is a depiction of a metal line pattern being generated on an IC substrate by photolithographic equipment.

FIG. 1A is a depiction of a contact or via pattern being generated on an IC substrate by photolithographic equipment. FIG. 1B is a depiction of a metal line pattern being generated on an IC substrate by photolithographic equipment.

Referring to FIG. 1A, the photolithographic equipment includes a light source (100), which may be a mercury lamp or ultraviolet laser, an illuminator (102) which has off-center apertures (104) to provide off-axis illumination and an optional center aperture (106), and a lens (108). A first photomask (110) which includes a first transparent mask substrate (112), typically fused quartz or glass with a low thermal expansion coefficient, and a first opaque or partially opaque layer (114), is inserted between the illuminator (102) and the lens (108). Open regions (116) corresponding to a pattern for contacts or vias are in the first opaque or partially opaque layer (114). An IC substrate (118) is coated on a top surface with a first photoresist layer (120) and is positioned below the lens (108), at a location such that the lens (108) forms an image of the open regions (116) in the first photomask (110) on the first photoresist layer (120) on the top surface of the IC substrate (118). A first quantity of light (122) of a narrow wavelength band emerges from the light source (100). Some light (124) of the first quantity of light (122) passes through the apertures (104, 106) in the illuminator (102) and impinges on the first photomask (110). Some light (126) from the impinging light (124) passes through the open regions (116), and a part of the light (126) enters the lens (108). The lens focuses the light that enters it to form an image (128) of the open regions (116) in the first photomask (110) on a top surface of the first photoresist layer (120). A minimum pitch for an image of a dense array pattern of vias or contacts that can be generated by the photolithographic equipment discussed here may be estimated by the following expression:

$$pitch_{Min,vias/contacts} = (0.56 \text{ to } 0.64) \cdot \frac{\lambda}{n \cdot NA} \qquad \text{Equation 1}$$

where: $\lambda$ is the wavelength of the first quantity of light (122) from the light source (100), n is an index of refraction of a medium between the lens (108) and the first photoresist layer (120), and NA is a numerical aperture of the lens (108).

After the first photoresist layer (120) is exposed to an image of the open regions (116), the IC substrate (118) is removed from the photolithographic equipment, and the IC substrate (118) with the first photoresist layer (120) undergoes a develop process which removes photoresist which was exposed to light in the image formed by the lens (108). The remaining photoresist on the top surface of the IC substrate (118) is used as a mask for etching holes for the vias and contacts, which are subsequently filled with metal.

Referring to FIG. 1B, the photolithographic equipment, referred to above, used to generate contact and via patterns is also used to generate metal line patterns, including light source (100), illuminator (102) with off-center apertures (104) and optional center aperture (106), and lens (108). A second photomask (130) which includes a second transparent mask substrate (132), also typically fused quartz or glass with a low thermal expansion coefficient, and a second opaque or partially opaque layer (134), is inserted between the illuminator (102) and the lens (108). Open regions (136) corresponding to a pattern for metal lines are in the second opaque or partially opaque layer (134). An IC substrate (118) is coated on a top surface with a second photoresist layer (138) and is positioned below the lens (108), at a location such that the lens (108) forms an image of the open regions (136) in the second photomask (130) on the second photoresist layer (138) on the top surface of the IC substrate (118). A second quantity of light (140) of a same narrow wavelength band as the first quantity of light emerges from the light source (100). Some light (142) of the second quantity of light (130) passes through the apertures (104, 106) in the illuminator (102) and impinges on the second photomask (130). Some light (144) from the impinging light (142) passes through the open regions (136), and a part of the light (144) enters the lens (108). The lens focuses the light that enters it to form an image (146) of the open regions (136) in the second photomask (130) on a top surface of the second photoresist layer (138). A minimum pitch for an image of a set of metal lines that can be generated by the photolithographic equipment discussed here may be estimated by the following expression:

$$pitch_{Min,lines} = (0.46 \text{ to } 0.54) \cdot \frac{\lambda}{n \cdot NA} \qquad \text{Equation 2}$$

where: $\lambda$ is the wavelength of the second quantity of light (140) from the light source (100), n is an index of refraction of a medium between the lens (108) and the second photoresist layer (138), and NA is a numerical aperture of the lens (108).

After the second photoresist layer (138) is exposed to an image of the open regions (136), the IC substrate (118) is removed from the photolithographic equipment, and the IC substrate (118) with the second photoresist layer (138) undergoes a develop process which removes photoresist which was exposed to light in the image formed by the lens (108). The remaining photoresist on the top surface of the IC substrate (118) is used as a mask for etching trenches for the metal lines, which are subsequently filled with metal.

Typically, patterns for metal lines and patterns for vias and contacts are generated using light of a same wavelength and lenses with equivalent numerical aperture values. Comparing Equations 1 and 2, it will be recognized that a dense array of vias cannot be patterned to connect a network of a first set of minimum pitch metal lines and a second set of minimum pitch metal lines on the next interconnect level, and oriented perpendicular to the first set, because the minimum pitch of the dense array of vias is larger than the minimum pitch of metal lines. The instant invention is manifested in integrated circuits which contain metal lines on minimum pitch and vias and contacts connecting the metal lines to form functional electronic circuits.

Figure 2:
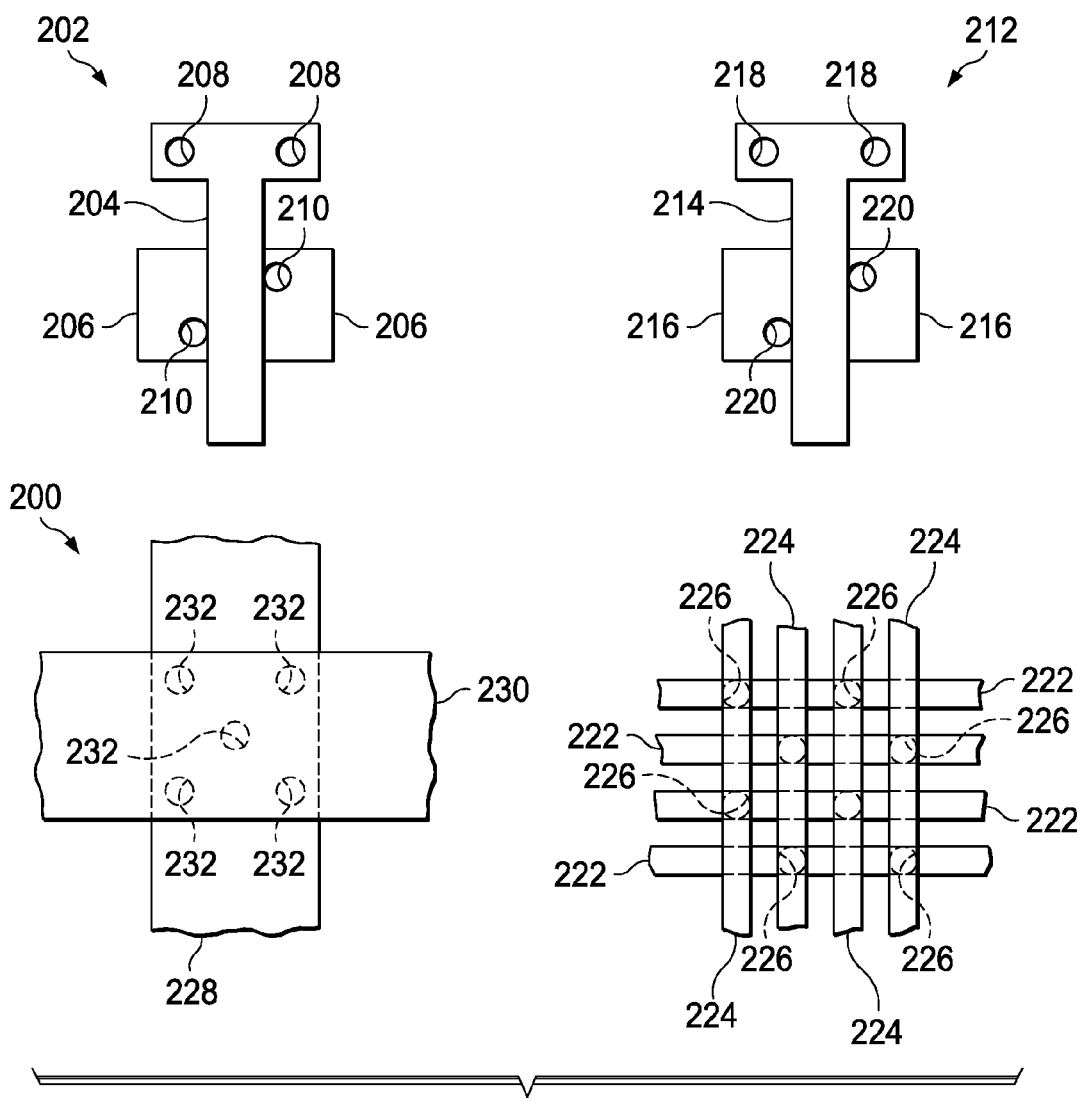
FIG. 2 is an illustration of an IC containing transistors, metal interconnect lines, vias and contacts according to an embodiment of the instant invention.

FIG. 2 is an illustration of an IC containing transistors, metal interconnect lines, vias and contacts according to an embodiment of the instant invention. IC (200) includes an N-channel MOS transistor (202), which has a first gate (204) over a first active region (206). A first set of contacts (208) to the gate and a second set of contacts (210) to the active area are formed on pitches consistent with Equation 2, according to an embodiment of the instant invention. Similarly, IC (200) includes a P-channel MOS transistor (212), which has a second gate (214) over a second active region (216). A third set of contacts (218) to the gate and a fourth set of contacts (220) to the active area are also formed on pitches consistent with Equation 2, according to an embodiment of the instant invention. IC (200) also includes minimum pitch horizontal metal lines (222) on an interconnect level, crossed by minimum pitch horizontal metal lines (224) on a next metal level, and vias (226), formed on pitches consistent with Equation 2, according to an embodiment of the instant invention, connecting horizontal metal lines (222) and horizontal metal lines (224). IC (200) also includes a wide metal line (228) on an interconnect level, crossed by another wide metal line (230) on a next interconnect level, connected by a plurality of vias formed on pitches consistent with Equation 2, and may be configured in a semi-dense array, according to an embodiment of the instant invention. The use of vias and contacts formed according to an embodiment of the instant invention is advantageous because it enables IC designs to minimize space, thus increasing the number of ICs per substrate and decreasing manufacturing costs per IC.

Figure 3:
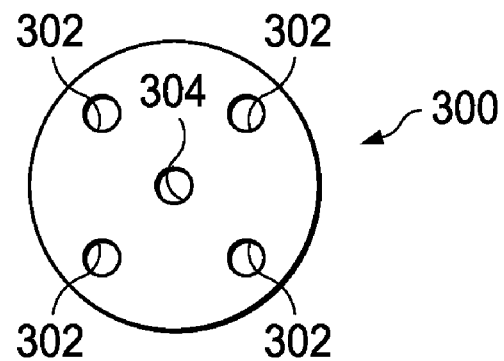
FIG. 3 is an illustration of a quadrupole or 5-pole illuminator in a conventional orientation.

FIG. 3 is an illustration of a quadrupole or 5-pole illuminator in a conventional orientation. Illuminator (300) includes quadrupole apertures (302) to provide off-axis illumination, oriented at a 45 degree angle from feature axes on an integrated circuit, and possibly a center aperture (304). Using this illuminator configuration, it is possible to generate via and contact patterns in an orthogonal configuration depicted in FIG. 4.

Figure 4:
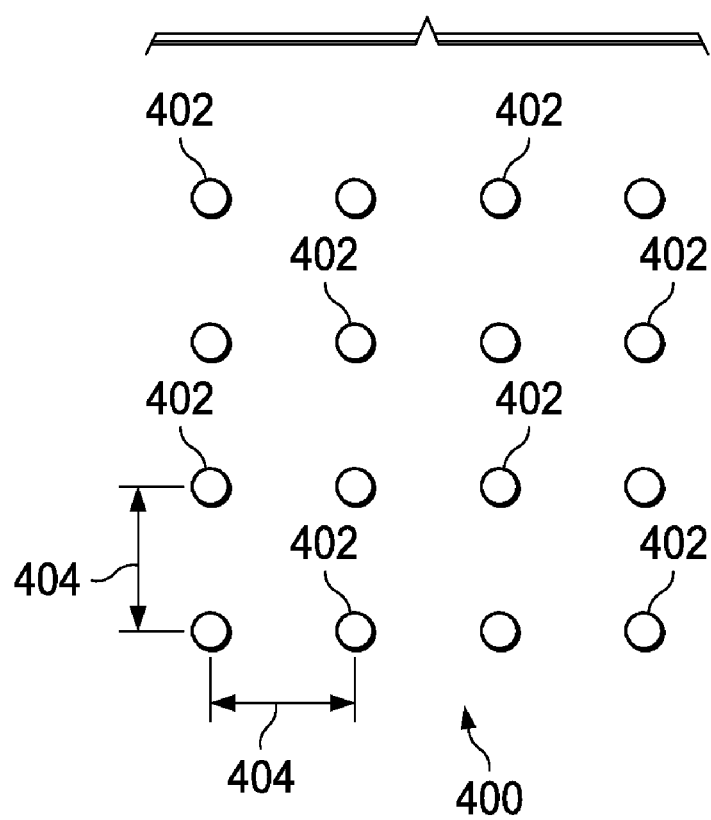
FIG. 4 is an illustration of a contact pattern obtained using the illuminator orientation depicted in FIG. 2.

FIG. 4 is an illustration of a contact pattern obtained using the illuminator orientation depicted in FIG. 3. An orthogonal array (400) of contacts or vias (402) is spaced at a minimum pitch (404) for the illuminator configuration used. The orthogonal array (400) is dense array, in that every intersection of a row and a column may have a via or contact.

Figure 5:
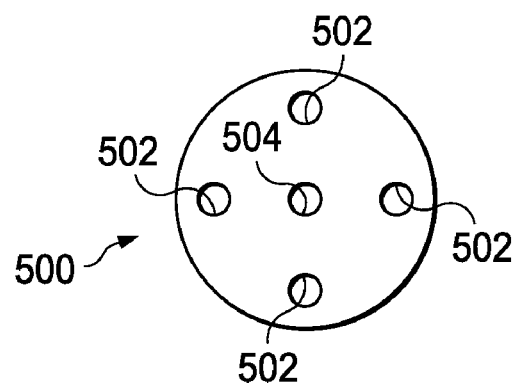
FIG. 5 is an illustration of a quadrupole or 5-pole illuminator oriented according to an embodiment of the instant invention.

FIG. 5 is a illustration of a quadrupole or 5-pole illuminator oriented according to an embodiment of the instant invention. Quadrupole or 5-pole illuminator (500) includes apertures (502) that are aligned with the axes of features on the IC in an embodiment of the instant invention, and thus are rotated 45 degrees from conventional aperture configurations. Illuminator (500) may also include a center aperture (504). An illuminator in this configuration may be used to print vias and contacts in an array with a smaller minimum pitch, as depicted in FIG. 6, than is possible using a conventionally oriented illuminator.

Figure 6:
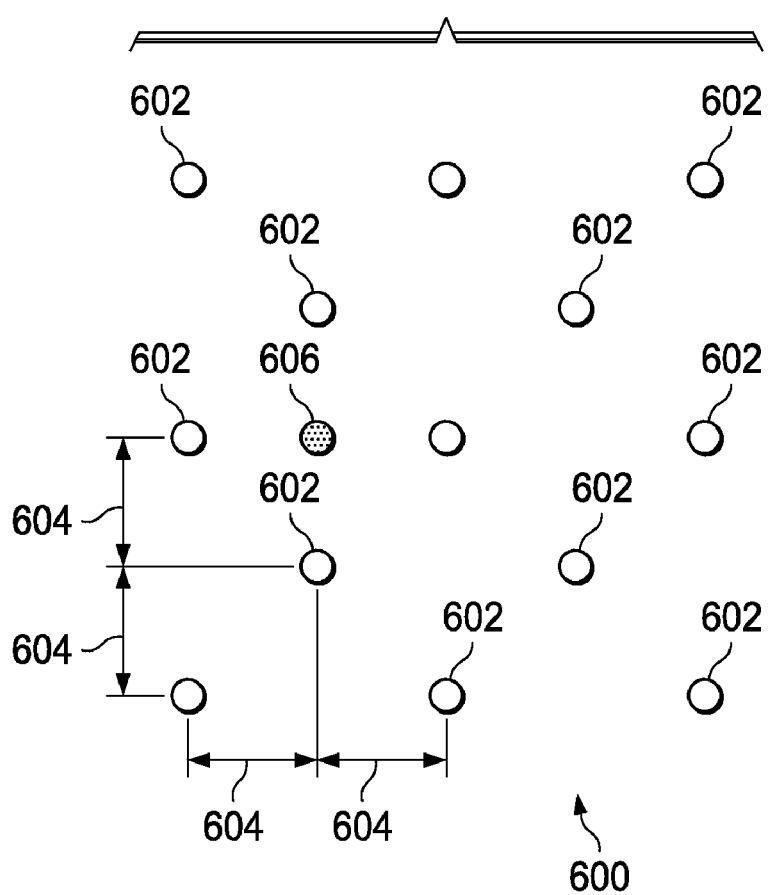
FIG. 6 is an illustration of a contact pattern obtained using the illuminator orientation depicted in FIG. 4.

FIG. 6 is an illustration of a contact pattern obtained using the illuminator orientation depicted in FIG. 5. An array (600) of vias or contacts (602), printed by the illuminator configuration depicted in FIG. 5, has a smaller pitch distance (604) in the directions of the axes of features in the IC. The array (600) is a semi-dense array, in that contacts are located on alternate intersections of row and columns. Sites (606) between printed sites (602) are not printable. A minimum pitch for contacts or vias formed according to this embodiment of the instant invention is approximately 30 percent less than a minimum pitch formed using an illuminator in a conventional orientation. This is advantageous because it enables IC designs to minimize space, thus increasing the number of ICs per substrate and decreasing manufacturing costs per IC.

What is claimed is:

1. A method of forming an integrated circuit comprising the steps of:
    providing a substrate;
    forming an n-channel MOS transistor by:
        forming a first gate structure on a top surface of the substrate; and
        forming n-type source and drain regions adjacent to the first gate structure;
    forming a p-channel MOS transistor by:
        forming a second gate structure on a top surface of the substrate; and
        forming p-type source and drain regions adjacent to the second gate structure; and
    forming contacts on, and electrically connected to, the first gate structure, the n-type source and drain regions, the second gate structure and the p-type source and drain regions, wherein the contacts are formed on a pitch in the range $0.56 \cdot \lambda_1/(n_1 \cdot NA_1)$ to $0.64 \cdot \lambda/(n \cdot NA)$, wherein $\lambda_1$ is a wavelength of light used to generate a pattern for the contacts, and wherein $n_1$ is an index of refraction of a first medium between a first lens in a first photolithographic printer used to generate the pattern for the contacts and the integrated circuit and wherein $NA_1$ is a numerical aperture of the lens;
    forming a first set of metal lines, which contact and overlap the contacts, and which are formed on a pitch in the range $0.46 \cdot \lambda_2/(n_2 \cdot NA_2)$ to $0.54 \cdot \lambda_2/(n_2 \cdot NA_2)$, wherein $\lambda_2$ is a wavelength of light used to generate a pattern for the first set of metal lines, and wherein $n_2$ is an index of refraction of a second medium between a second lens in a second photolithographic printer used to generate the pattern for the first set of metal lines and the integrated circuit, and wherein $NA_2$ is a numerical aperture of the second lens.

2. The method of claim 1, wherein the method further comprises the steps of:
    forming vias which contact and overlap the first set of metal lines, and which are formed on a pitch in the range $0.56 \cdot \lambda_3/(n_3 \cdot NA_3)$ to $0.64 \cdot \lambda_3/(n_3 \cdot NA_3)$, wherein $\lambda_3$ is a wavelength of light used to generate a pattern for the vias, and wherein $n_3$ is an index of refraction of a third medium between a third lens in a third photolithographic printer used to generate the pattern for the vias and the integrated circuit, and wherein $NA_3$ is a numerical aperture of the third lens; and
    forming a second set of metal lines which contact and overlap the vias, and which are formed on a pitch in the range $0.46 \cdot \lambda_4/(n_4 \cdot NA_4)$ to $0.54 \cdot \lambda_4/(n_4 \cdot NA_4)$, wherein $\lambda_4$ is a wavelength of light used to generate a pattern for the second set of metal lines and wherein $n_4$ is an index of refraction of a fourth medium between a fourth lens in a fourth photolithographic printer used to generate the pattern for the second set of metal lines and the integrated circuit, and wherein $NA_4$ is a numerical aperture of the fourth lens.

3. The method of claim 1, wherein the step of forming contacts further comprises the steps of:
    providing a first illuminator, wherein the illuminator includes apertures to provide off-axis illumination;
    providing a first photomask, which contains a contact pattern;
    applying a first layer of photoresist to a top surface of the substrate and the transistors;
    rotating the first illuminator to align the apertures with the first set of metal lines; and
    exposing the first layer of photoresist in regions defined by the first photomask with light from the first illuminator.

4. The method of claim 2, wherein the step of forming vias further comprises the steps of:
    providing a second illuminator, wherein the illuminator includes apertures to provide off-axis illumination;
    providing a second photomask, which contains a via pattern;
    applying a second layer of photoresist to a top surface of the substrate and the transistors;
    rotating the second illuminator to align the apertures with the second set of metal lines; and
    exposing the second layer of photoresist in regions defined by the second photomask with light from the second illuminator.

5. The method of claim 3, wherein the first illuminator is a quadrupole illuminator.

6. The method of claim 3, wherein the first illuminator is a 5-pole illuminator.

7. The method of claim 4, wherein the second illuminator is a quadrupole illuminator.

8. The method of claim 4, wherein the second illuminator is a 5-pole illuminator.

9. The method of claim 1, wherein a subset of the contacts are configured in a semi-dense array that is a rectangular array in which alternate intersections of rows and columns are occupied by contacts.

10. The method of claim 2, wherein a subset of the vias are configured in a semi-dense array that is a rectangular array in which alternate intersections of rows and columns are occupied by vias.

* * * * *